(12) United States Patent
Voth et al.

(10) Patent No.: US 7,340,566 B2
(45) Date of Patent: Mar. 4, 2008

(54) SYSTEM AND METHOD FOR INITIALIZING A MEMORY DEVICE FROM BLOCK ORIENTED NAND FLASH

(75) Inventors: David William Voth, Woodinville, WA (US); Avi R. Geiger, Seattle, WA (US)

(73) Assignee: Microsoft Corporation, Redmond, WA (US)

( * ) Notice: Subject to any disclaimer, the term of this patent is extended or adjusted under 35 U.S.C. 154(b) by 309 days.

(21) Appl. No.: 10/611,129

(22) Filed: Jun. 30, 2003

(65) Prior Publication Data

US 2004/0076069 A1  Apr. 22, 2004

Related U.S. Application Data

(60) Provisional application No. 60/420,364, filed on Oct. 21, 2002.

(51) Int. Cl.
*G06F 12/00* (2006.01)
(52) U.S. Cl. .................. 711/137; 711/154; 711/170; 712/205
(58) Field of Classification Search ............ 711/137, 711/154, 158, 170–173, 125–126; 712/205
See application file for complete search history.

(56) References Cited

U.S. PATENT DOCUMENTS 5,566,324 A * 10/1996 Kass .......................... 711/160
5,913,215 A * 6/1999 Rubinstein et al. ........... 707/10
6,154,837 A * 11/2000 Fudeyasu et al. .............. 713/2
6,601,167 B1 * 7/2003 Gibson et al. ................. 713/2
2003/0204675 A1 * 10/2003 Dover et al. ................ 711/137
2003/0233533 A1 * 12/2003 Avraham ....................... 713/1

OTHER PUBLICATIONS

Dr. Nic Peeling and Dr. Julian Satchell, Analysis of the Impact of Open Source Software, Oct. 2001, found on www.govtalk.gov.uk/documents/QinetiQ_OSS_rep.pdf pp. 8.*
LILO boot.c source code found on lilo.go.dyndns.org.*
Tom Wett and Stuart Levy, Flash—The Memory Technology of the Future That's Here Today, Aerospace and Electronics Conference, 1995., NAECON IEEE 1995 National, May 22-26, 1995, pp. 359-364 vol. 1.*
Arthur Hunter; "NAND Flash Memory; the small storage medium of the future"; Elektron—Feb. 1996; pp. 78-79.
June Lee et al.; "A 90-nm CMOS 1.8-V 2-Gb NAND Flash Memory for Mass Storage Applications"; 2003 IEEE Journal of Solid-State Circuits, vol. 38, No. 11, Nov. 2003; pp. 1934-1941.

* cited by examiner

*Primary Examiner*—Brian R. Peugh
*Assistant Examiner*—Matthew Bradley
(74) *Attorney, Agent, or Firm*—Merchant & Gould P.C.

(57) ABSTRACT

Described is a system and method for initializing other memory from block oriented NAND flash by central processing units (CPUs) designed for non-NAND flash. The system employs a sequential loader that avoids the use of branches, loops, and the like, to enable a portion of the sequential loader to be sequentially fetched and executed by the CPU. The fetched and executed portion of the sequential loader is configured to copy additional instructions from NAND flash into random-access memory, such that the CPU may be fully booted from the sequential loader by executing code that has been copied into the random-access memory.

20 Claims, 2 Drawing Sheets

SYSTEM AND METHOD FOR INITIALIZING A MEMORY DEVICE FROM BLOCK ORIENTED NAND FLASH

CROSS REFERENCE TO RELATED APPLICATIONS

This application claims the benefit of U.S. Provisional Application Ser. No. 60/420,364, filed Oct. 21, 2002, the benefit of the earlier filing date of which is hereby claimed under 35 U.S.C. § 119(e).

FIELD OF THE INVENTION

The present invention relates to computer-executable software, and more particularly to initializing other memory with a loader sequentially fetched from NAND flash.

BACKGROUND OF THE INVENTION

Traditionally, two main technologies have dominated the non-volatile flash memory market: NOR and NAND. NOR flash was first introduced around 1988, revolutionizing a market that was then dominated by EPROM and EEPROM devices. NAND flash architecture was introduced around 1989.

NOR flash typically enables higher read performance than NAND flash. Therefore, NOR flash typically has been employed for such applications as code storage and execution in such devices as simple consumer appliances, low end cell phones, embedded applications, and the like. However, NAND flash offers extremely high cell densities, higher capacities, and faster write/erase performance than NOR flash. Moreover, NAND flash typically is less expensive than NOR flash. Therefore, NAND flash has typically been employed in data storage applications, including MP3 players, digital cameras, and memory devices.

However, because of its higher capacity, lower cost, faster overall performance, and longer life span, an increasing number of mobile device manufacturers are exploring the use of NAND flash for code storage. One such use has included storage of a bootstrap program, sometimes referred to as a loader.

Unfortunately, because NAND flash is a block oriented memory device, it typically requires a command to be sent that readies a memory page to be read. When a Central Processing Unit (CPU) attempts to boot from flash memory, the CPU typically begins reading instructions immediately. However, if a CPU is not properly configured, it will be unable to boot from block oriented NAND flash. Newer NAND flash devices are capable of loading a first page automatically on a power-up, so that it may be possible to read the loader program. However, because NAND flash remains constrained to block orientation, it has been difficult to enable loader programs to properly execute. Therefore, it is with respect to these considerations and others that the present invention has been made.

SUMMARY OF THE INVENTION

The present invention is directed to addressing the above-mentioned shortcomings, disadvantages and problems, and will be understood by reading and studying the following specification. A method and apparatus are directed to initializing memory from block oriented NAND flash by central processing units (CPUs) designed for non-NAND flash. A sequential loader is configured to reside within a first block of the block oriented NAND flash. A portion of the sequential loader is sequentially fetched and executed from the NAND flash. The executed portion of the sequential loader is configured to copy a remaining portion of the sequential loader from NAND flash into RAM, such that the CPU may be fully booted from the sequential loader.

In one aspect of the present invention, a method is directed to initializing memory. In the method, sequentially fetched instructions from a sequential memory are executed. A program is created in random-access memory by executing the instructions. The program in random-access memory is executed to sequentially fetch the other instructions from the sequential memory, and to jump to another instruction in the random-access memory.

In another aspect of the present invention, a computer-readable medium having computer-executable components is directed to initializing a memory device. The computer-executable components include a sequential memory device, a random-access memory device, a loader, and a processor. The loader resides within the sequential memory device, and comprises a plurality of instructions. The processor is coupled to the sequential memory device and to the random-access memory device. The processor sequentially fetches and executes instructions of the loader from the sequential memory device. The processor creates a computer-executable program in the random-access memory device by executing the sequentially fetched instruction. The computer-executable program in the random-access memory device is executed to copy the other instruction of the loader from the sequential memory device. A jump instruction is executed to the other instruction of the loader in the random-access memory device to enable the processor to be booted from the loader by executing the instructions that have been copied to the random-access memory device.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description of the Invention, which is to be read in association with the accompanying drawings, wherein.

DETAILED DESCRIPTION OF THE PREFERRED EMBODIMENT

The present invention now will be described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art. Among other things, the present invention may be embodied as methods or devices. Accordingly, the present invention may take the form of an entirely hardware embodiment, an entirely software embodiment or an embodiment combining software and hardware aspects. The following detailed description is, therefore, not to be taken in a limiting sense.

The terms "connected," and "coupled" include a direct connection between the things that are connected, or an indirect connection through one or more either passive or active intermediary devices or components.

The meaning of "a," "an," and "the" include plural references. The meaning of "in" includes "in" and "on." Additionally, a reference to the singular includes a reference to the plural unless otherwise stated or is inconsistent with the disclosure herein.

Briefly stated, the present invention is directed to a system and method for initializing other memory from block oriented NAND flash by central processing units (CPUs) typically designed for non-NAND flash. Today's typical NAND flash provides 512 bytes, or 128 32-bit instructions, on the first page. Where instructions are to be directly executed from NAND flash, the instructions are fetched sequentially within each page. The present invention therefore, employs a sequential loader that avoids the execution of branches, loops, and the like, within the first block of instructions, to create and execute a program in random-access memory that is capable of sequentially fetching and copying instructions from the NAND flash, and enabling them to be executed in a non-sequential manner from the random-access memory. That is, the first instruction of the sequential loader in a pre-determined block oriented NAND flash address is fetched and executed. Then the next sequential instruction of the block oriented NAND flash is fetched and executed, and so on. The executed instructions are configured to copy the remaining instructions from the NAND flash into random-access memory, such that the CPU may be fully booted from the sequential loader instructions by executing the instructions that have been copied into the random-access memory. Once the code is being executed from random-access memory, it may include branches, loops, jumps, and the like.

Illustrative Operating Environment

Figure 1:
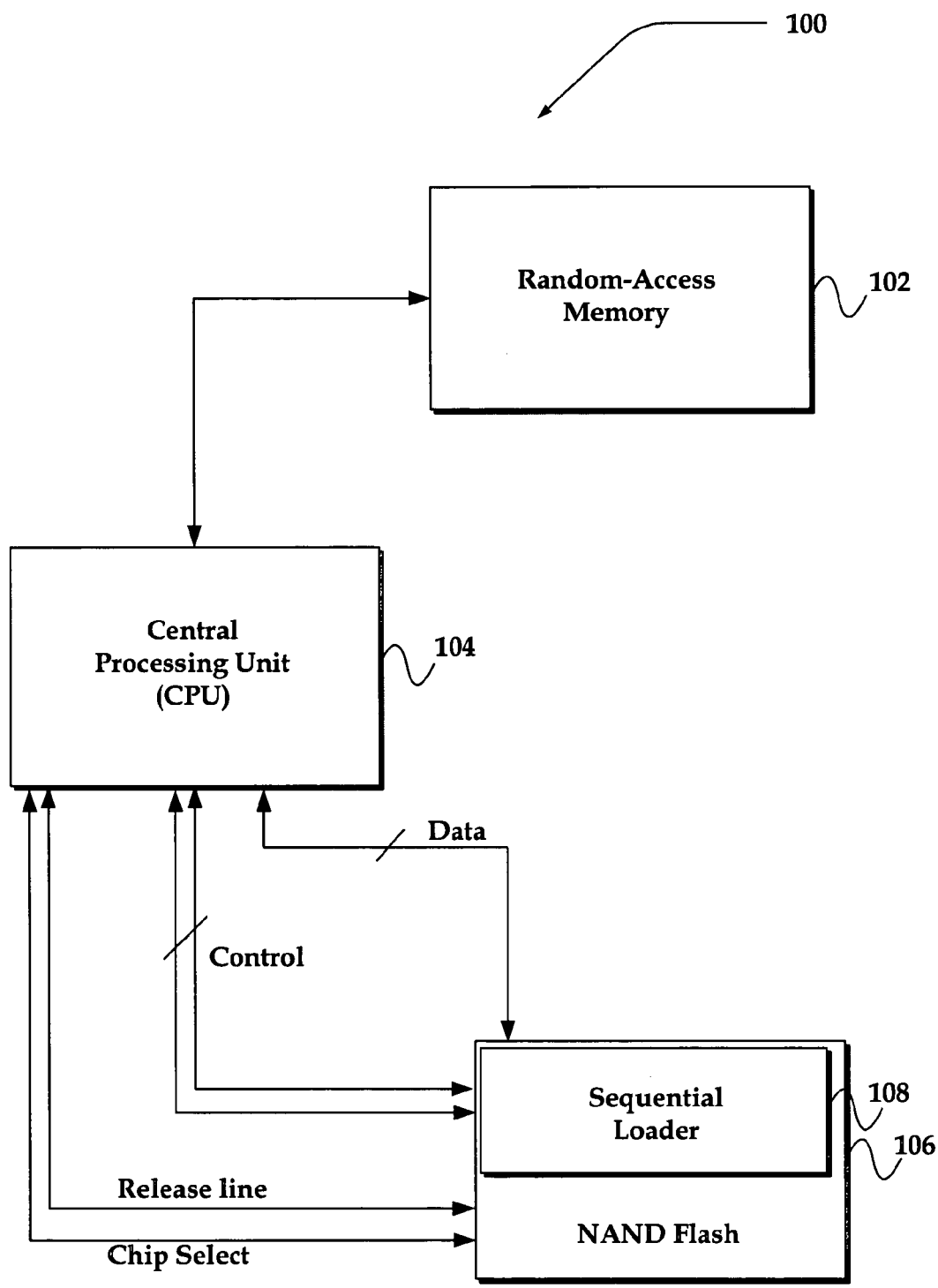
FIG. 1 is a functional block diagram illustrating an embodiment of an exemplary device for practicing the present invention.

FIG. 1 is a functional block diagram illustrating an embodiment of an exemplary device 100 for practicing the present invention. In one embodiment of the present invention device 100 is implemented in a mobile communications device, such as a personal digital assistant (PDA), smart phone, and the like. Device 100 may also be employed within hand held computers, personal computers, multiprocessor systems, microprocessor-based or programmable consumer electronics, network PCs, wearable computers, and the like.

Device 100 may include many more components than those shown in FIG. 1. The components shown, however, are sufficient to disclose an illustrative embodiment for practicing the invention.

As shown in the figure, device 100 includes Central Processing Unit (CPU) 104, memory 102, and NAND flash 106. NAND flash includes sequential loader 108. Memory 102 is in communication with CPU 104. CPU 104 is also in communication with NAND flash 106 through several interfaces, including data lines, control lines, address lines, a release line, a chip select line, and the like.

Memory 102 generally includes any volatile memory, such as Random Access Memory (RAM), dynamic RAM, synchronous dynamic RAM (SDRAM), Rambus DRAM (RD DRAM), static RAM (SRAM), cache memory, and the like.

NAND flash 106 includes virtually any memory device configured to employ NAND gate technologies, including type II PC cards, compact flash, smart media, memory sticks, and the like. NAND flash 106 is also configured to store applications including sequential loader 108, an operating system (not shown), and the like.

It is noted that while the invention is described in terms of loading instructions from NAND flash, the present invention is not so limited. For example, NAND flash 106 may also represent a First-In/First-Out (FIFO) memory, an external initialization device that is configured to provide sequential instructions, or the like. NAND flash 106 may also represent NOR flash that is configured to provide sequential instructions. Where NOR flash is employed in this manner, one need not employ address lines to the NOR flash, thereby saving costs.

CPU 104 may include any of a variety of processing devices that is configured to read from flash, and read and write to memory 102. CPU 104 is configured to identify a first address within NAND flash 106, and to read a block of instructions. CPU 104 is further configured to provide the read block of instructions to memory 102 from where the instructions may be executed.

Sequential loader 108 includes virtually any sequentially fetched application that enables loading of another program such as an operating system during boot-up, and the like. For example, sequential loader 108 may include assembly language instructions and data, or any other low-level programming code and related data. Sequential loader 108 typically is configured to reside within a first block of NAND flash 106. As such, in one embodiment, sequential loader 108 is arranged to reside in the first 128, 32-bit instruction locations of NAND flash 106. In one embodiment, the sequential loader 108 comprises less than 128 sequentially fetchable instructions.

Generalized Operation

Figure 2:
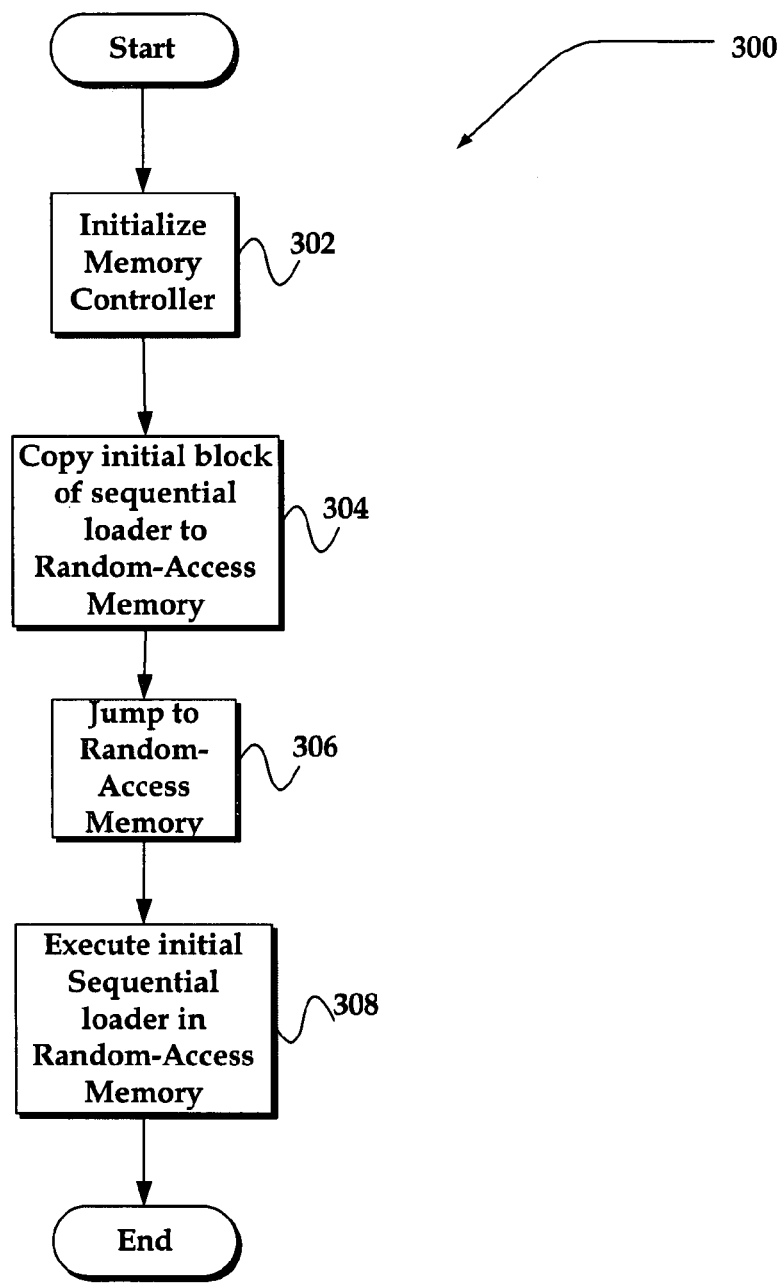
FIG. 2 is a flow diagram generally showing one embodiment of a process of initializing memory with a sequential loader from NAND Flash, in accordance with the present invention.

The operation of certain aspects of the present invention will now be described with respect to FIG. 2. FIG. 2 is a flow diagram generally showing one embodiment of a process of initializing memory with a sequential loader from NAND Flash, in accordance with the present invention. Process 300 illustrates one embodiment of an operation of sequential loader 108 in FIG. 1. As may be seen, process 300 does not include branches, loops, jumps, and the like, beyond a final branch to memory. Once code of the sequential loader is sequentially fetched and executed to copy other instructions into random-access memory, the instructions may then be executed from random-access memory and include branches, loops, jumps, and the like.

Process 300 is entered when an initial flash block oriented read is initiated, such as when CPU 104 in FIG. 1 reads the first flash block of sequential loader 108. The CPU is configured to read instructions from a predefined start address in NAND memory. In one embodiment, the start address is 0, which represents the first address in the first block of NAND memory. After executing each instruction of the sequential loader, the CPU is configured to fetch and execute the next word in the flash block. Moreover, the instructions within each flash block of instructions are sequentially read, thereby minimizing the need for address lines from CPU 104 in FIG. 1.

Process 300 begins, after a start block, at block 302 where sequential loader initializes memory addresses. Initialization of memory addresses may include loading registers with enable bits, timing bits, information associated with a type of memory employed, clocking information and the like.

Process 300 proceeds to block 304, where an initial flash black of instructions associated with the sequential loader that are sequentially fetched and executed to copy instructions into random-access memory by the CPU, or the like. At block 304, copied instructions are operated on substantially like data, as they are copied into the random-access memory. Block 304 continues to copy instructions sequentially until substantially the entire first block of NAND flash has been copied, or until the last instruction of the sequential loader.

Process 300 continues to block 306, where a jump instruction is executed from within the sequential loader. The jump instruction directs continued execution of sequential loader to occur from within random-access memory. Upon completion of block 306, process 300 flows to block 308, where the flash block of instructions associated with the sequential loader that is copied into random-access memory is executed. Upon completion of block 308, process 300 ends. Hereafter, instructions may include branches, loops, and the like that execute from within random-access memory.

It will be understood that each block of the flowchart illustration, and combinations of blocks in the flowchart illustration, can be implemented by computer program instructions. These program instructions may be provided to a processor to produce a machine, such that the instructions, which execute on the processor, create means for implementing the actions specified in the flowchart block or blocks. The computer program instructions may be executed by a processor to cause a series of operational steps to be performed by the processor to produce a computer implemented process such that the instructions, which execute on the processor provide steps for implementing the actions specified in the flowchart block or blocks.

Accordingly, blocks of the flowchart illustration support combinations of means for performing the specified actions, combinations of steps for performing the specified actions and program instruction means for performing the specified actions. It will also be understood that each block of the flowchart illustration, and combinations of blocks in the flowchart illustration, can be implemented by special purpose hardware-based systems which perform the specified actions or steps, or combinations of special purpose hardware and computer instructions.

The above specification, examples, and data provide a complete description of the manufacture and use of the composition of the invention. Since many embodiments of the invention can be made without departing from the spirit and scope of the invention, the invention resides in the claims hereinafter appended.

We claim:

1. A computer-implemented method of initializing memory, comprising:
   accessing a sequential memory that comprises a sequential loader that includes instructions that are configured to boot a CPU; wherein accessing the sequential memory is performed only by the CPU;
   sequentially copying instructions from the sequential memory to a random-access memory using only the CPU executing logic for performing operations until a majority of all of the instructions of a sequential loader have been copied to the random-access memory or until an entire first block of the sequential memory has been copied to the random-access memory;
   executing a jump instruction from within the sequential loader to a location within the random-access memory; and
   continuing execution of the sequential loader from within the random-access memory to boot the CPU.

2. The method of claim 1, wherein the sequential memory further comprises at least one of a block oriented NAND flash, a FIFO device, and a memory device configured to provide sequential data when accessed.

3. The method of claim 1, wherein the sequential memory further comprises NOR flash configured to enable instructions to be sequentially fetched.

4. The method of claim 1, wherein each sequentially fetched instruction is further arranged to reside within a first block of the sequential memory.

5. The method of claim 4, wherein the first block of the sequential memory further comprises approximately 128, 32-bit instructions.

6. The method of claim 1, wherein the program further comprises less than approximately 128 sequentially fetchable instructions.

7. The method of claim 1, wherein accessing the sequential memory comprises accessing a first address of the sequential memory.

8. The method of claim 1, wherein the sequential loader initializes memory; wherein the initializing of the memory comprises loading registers with enable bits and timing bits.

9. The method of claim 1, wherein sequentially copying the instructions comprises accessing a first block of the sequential memory.

10. A computer-readable medium having computer-executable components for initializing a memory device, comprising:
    a sequential memory device;
    a random-access memory device;
    a loader, residing within the sequential memory device, that comprises instructions for booting a central processing unit; and
    coupled to the sequential memory device and to the random-access memory device, a processor that is configured to perform actions, including:
      sequentially fetching instructions of the loader from the sequential memory device using only the central processing unit executing logic for performing operations until a majority of all of the instructions of a sequential loader have been copied to the random-access memory device or until an entire first block of the sequential memory has been copied to the random-access memory device;
      creating a computer-executable program in the random-access memory device from the sequentially fetched instructions, and
      executing a jump instruction; wherein the jump instruction is one of the instructions of the loader, wherein execution of the jump instruction enables the processor to be booted in part from the loader sequentially fetched into the random-access memory device.

11. The computer-readable medium of claim 10, further comprising at least one of a personal digital assistant (PDA), smart phone, handheld computer, personal computer, microprocessor-based system, programmable consumer electronics, network PC, and a wearable computer.

12. The computer-readable medium of claim 10, wherein the random-access memory device further comprises at least one of a Random Access Memory (RAM), dynamic RAM, synchronous synamic RAM (SDRAM), Rambus DRAM (RD DRAM), static RAM (SRAM), and cache memory.

13. The computer-readable medium of claim 10, wherein the loader is further configured to reside within a first block of the sequential memory device.

14. The computer-readable medium of claim 13, wherein the first block of the sequential memory device further comprises approximately 128, 32-bit instructions.

15. The computer-readable medium of claim 10, wherein the sequential memory device further comprises at least one of a block oriented NAND flash, a FIFO device, and a device configured to provide sequential data when accessed.

16. The computer-readable medium of claim 10, wherein the sequential memory device further comprises NOR flash configured to enable instructions to be sequentially fetched.

17. The computer-readable medium of claim 10, wherein the plurality of instructions of the loader further comprises less than approximately 50 sequentially fetchable instructions.

18. The computer-readable medium of claim 10, wherein after executing the jump instruction the instructions may further comprise branches and loops that execute from the random-access memory.

19. The computer-readable medium of claim 10, wherein the processor is configured to identify a first address within the sequential memory.

20. An apparatus for initializing memory, comprising:

a means for sequentially fetching instructions from a sequential memory by copying a first block of the sequential memory using a single processor executing logic for performing operations and copying the fetched instructions to a random-access memory; wherein the instructions within the sequential memory comprise a loader that is configured to at least partially boot the single processor; a means from creating a program in the random-access memory from the sequentially fetched instructions, wherein the program is enabled to copy another instruction from the sequential memory; and a means for executing a jump instruction from one of the instructions that comprises the loader; wherein the jump instruction enables the processor to be booted in part from the loader sequentially fetched into the random-access memory device.

* * * * *

UNITED STATES PATENT AND TRADEMARK OFFICE
CERTIFICATE OF CORRECTION

PATENT NO. : 7,340,566 B2
APPLICATION NO. : 10/611129
DATED : March 4, 2008
INVENTOR(S) : David William Voth et al.

It is certified that error appears in the above-identified patent and that said Letters Patent is hereby corrected as shown below:

In column 5, line 5, delete "black" and insert --block--, therefor.

In column 6, line 66, in Claim 12, delete "synamic" and insert --dynamic--, therefor.

Signed and Sealed this
Twenty-second Day of February, 2011

David J. Kappos
*Director of the United States Patent and Trademark Office*